United States Patent [19]
Rider

[11] 4,176,398
[45] Nov. 27, 1979

[54] RAMP GENERATOR

[75] Inventor: Dennis G. Rider, Pataskala, Ohio

[73] Assignee: Battelle Development Corporation, Columbus, Ohio

[21] Appl. No.: 881,848

[22] Filed: Feb. 27, 1978

[51] Int. Cl.² .......................... G06J 1/00; H03K 4/08
[52] U.S. Cl. ................................. 364/607; 307/228; 328/181; 340/347 NT; 364/858
[58] Field of Search .............. 364/605, 607, 608, 718, 364/858; 340/347 NT; 307/227, 228; 328/181, 186

[56] References Cited
U.S. PATENT DOCUMENTS

| | | | |
|---|---|---|---|
| 3,603,981 | 9/1971 | Rollenhagen | 364/607 X |
| 3,649,826 | 3/1972 | Larsson et al. | 364/607 X |
| 3,701,145 | 10/1972 | Bergin | 340/347 NT |
| 3,971,923 | 7/1976 | Linder | 364/607 |

Primary Examiner—Joseph F. Ruggiero
Attorney, Agent, or Firm—Philip M. Dunson

[57] ABSTRACT

Apparatus receiving step voltage inputs provides an output voltage that moves as a linear ramp from step to step. Each new input causes an amplifying circuit to connect a predetermined potential to an integrator, starting a new ramp. A comparator circuit receives voltages proportional respectively to the input and the ramp output, and when they become equal it stops the ramp. An inverter is automatically connected into the amplifying circuit when needed to change the polarity of the potential to the integrator, and thus to reverse the direction of the ramp. Manual and automatic adjusting and switching means control the operating sequences and parameters.

36 Claims, 4 Drawing Figures

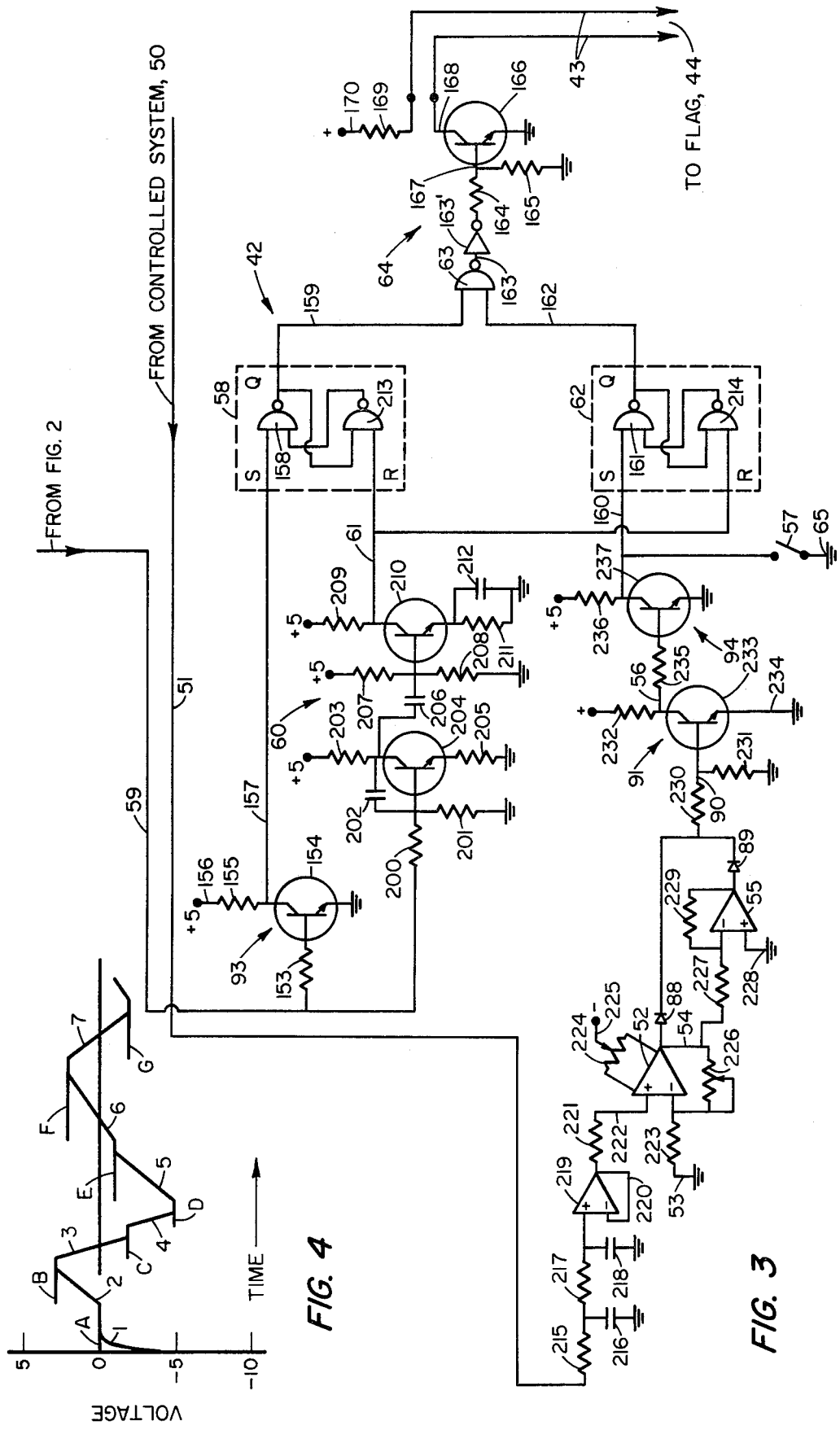

RAMP GENERATOR

INTRODUCTION AND BACKGROUND

The apparatus shown between the vertical dashed lines in FIG. 1, and in more detail in FIG. 2 plus FIG. 3, typically is constructed as a separate unit for use with input and control apparatus as shown in the left hand part of FIG. 1 and for providing an output voltage to a controlled system as shown in the right hand part of FIG. 1. The unit, conveniently referred to herein either as a hybrid function generator or more simply as a ramp generator, is intended primarily for receiving successive input voltages and providing output voltages that become proportional thereto. In the embodiment of the function generator shown in the drawings the proportion is 1 to 1, so that the output voltages become equal to the input voltages.

The output voltages are provided in the same time sequence as the input voltages that are received; but instead of jumping instanteously from one voltage level to the next in stepwise fashion the output voltage increases or decreases in a continuous manner, approximately linearly with time, from each level to the next. Then it remains at that level until a new and different input voltage triggers it to provide a linear ramp to the next level as determined by the next input voltage.

The hybrid function generator typically is designed to receive its input voltages and control signals from a computer that comprises at least a central processing unit 46 connected as indicated at 47 to provide digital signals to a digital to analog converter 48 for providing as indicated at 49 an analog voltage input 11 having an amplitude that is determined by the digital signal at 47. The computer typically also comprises transistor-transistor logic or other suitable digital switching circuitry 36 that is actuated by digital logic signals from the central processing unit 46, as indicated at 67, and providing digital logic signals 36D, 36R, 36S, selectively, in response thereto.

The computer is programmed in any convenient manner, conventional or otherwise, to provide the appropriate input voltages 11 and control signals 36D, 36R, 36S at the appropriate times in accordance with the selected program and input data. The computer typically also comprises flag responsive digital logic circuitry 44 for receiving flag signals from the hybrid function generator, as is indicated at 43, and feeding digital logic signals to the central processing unit 46 in response thereto, as is indicated in 45. The computer program typically includes routine tests or other steps, or both, responsive at least in part to the flag signals at 45.

All of this in actual operation requires only a bare minimum of overhead time from the computer. In fact this is an important advantage of the present invention, which generates a stepless linear ramp output voltage from each desired level to the next with only this bare minimum of interaction with the computer.

In contrast, earlier typical known methods of generating an analog ramp voltage require substantially continuous operation of a computer to generate each ramp not as a truly continuous linear function of time but actually as an approximation thereof comprising a series of small steps, each actuated by a separate digital signal from the computer, all the way from each main step to the next. In other words as long as the ramp is being generated the computer is continuously busy counting up or down, jumping from point to point along the ramp. Typical appratus of this type is disclosed in U.S. Pat. No. 3,971,923 of Linder.

The present invention is quite versatile. Typical apparatus as shown in the drawings has been used to provide linear ramp voltages at rates as high as 100 cycles (excursions typically of 20 volts total from maximum positive voltage to maximum negative voltage, and then back) per second, and at rates as low as 25 seconds per cycle (about 2.4 cycles per minute). Even at high ramping rates, only a negligible amount of computer time is required. So even a fairly slow computer can be shared without perceptibly reducing the time available for other tasks.

The controlled system 50 may comprise virtually any type of apparatus (typically a servo system) that can be controlled at least in part by analog voltages. Where appropriate, the operation of the apparatus for a specific purpose may be controlled by a predetermined sequence of digital words specifiying the input voltages to be fed to the ramp generator. Or the operating program may include calculations by the computer of later input and rate controlling instructions based upon data from the controlled system 50 resulting from an earlier input or earlier inputs. For example, the computer might calculate the next input voltage on the basis of a quantitative effect produced in the controlled system by the preceding input.

Thus, the novel combination of circuitry and associated features in the present invention provides substantial advantages in greatly reduced costs of computer time, as well as greater convenience and other advantages that will be apparent from the disclosure herein.

SUMMARY

Typical apparatus according to the present invention, for receiving a succession of input voltages that may vary in discrete steps in amplitude and polarity with time and providing a substantially linear ramp output voltage responsive thereto, comprises means for receiving each input voltage and providing a potential responsive thereto, integrating means for receiving each potential, providing in response thereto an output voltage that changes approximately proportionally with time from its old value responsive to the preceding input voltage and potential to a new value that is responsive to the new input voltage and potential each time an input voltage is received that differs by more than a negligible amount from the preceding one, and then maintaining the output voltage substantially constant until the next such time, and difference amplifier means for receiving a first voltage proportional to the input voltage and a second voltage proportional to the output voltage and providing a comparison voltage responsive to any more than negligible difference between the first and second voltages, switching means responsive to the difference amplifier means for connecting the integrating means selectively, either (a), while such a difference exists, to the potential responsive to the input voltage, for beginning and then continuing its integrating, or (b), when such a difference does not exist, to the comparison voltage, for correcting the output voltage, when necessary, to a value that is a predetermined proportion of the input voltage, and, when the output voltage is correct, maintaining it substantially constant.

The comparison voltage provided by the difference amplifier means typically is connected (a) to first rectifier means connected to conduct current in a predetermined direction between the difference amplifier means and a preselected point in the apparatus, and (b) to inverting amplifier means the output of which is connected to second rectifier means connected to conduct current in the same predetermined direction between the inverting amplifier means and the preselected point, so that a comparison voltage of one polarity provides current in the predetermined direction through the first rectifier means and a comparison voltage of the opposite polarity provides current in the same predetermined direction through the second rectifier means and thus the difference amplifier means provides signals of the same polarity at the preselected point regardless of the polarity of the comparison voltage. The switching means is connected to be actuated by a signal at the preselected point.

The switching means typically comprises switching gate means having first and second switching paths therein, each being open when the other is closed and closed when the other is open, responsive to a substantially zero actuating voltage thereto for opening the first path and closing the second path, and responsive to a larger actuating voltage thereto for closing the first path and opening the second path, the first path being connected between the integrating means and the potential responsive to the input voltage, and the second path being connected between the integrating means and the comparison voltage.

The potential providing means typically comprises an input isolating amplifier connected to receive the input voltage, an inverting amplifier with substantial gain connected to receive the output from the isolating amplifier, and a constant voltage amplifier connected to receive the output from the inverting amplifier and to provide, with delay, the potential to the integrating means.

The input to the constant voltage amplifier is limited by voltage clamping means that typically comprises first rectifying means connected from the input of the constant voltage amplifier to an adjustable source of positive voltage and second rectifying means connected from the input of the constant voltage amplifier to an adjustable source of negative voltage, for providing firstly an adjustment of any positive input and secondly an adjustment of any negative input to the constant voltage amplifier and thus providing respectively independent adjustments firstly of the rate of change of the output voltages in the positive direction and secondly of the rate of change of the output voltages in the negative direction provided by the integrating means.

Typically the delay is provided by resistance and capacitance means connected at the output of the constant voltage amplifier. The potential providing means typically comprises also an adjustable resistance between the constant voltage amplifier and the integrating means, for providing a continuously variable adjustment of current therethrough to the integrating means and thus also of the rate of change in the output voltage provided by the integrating means.

The integrating means typically comprises a direct coupled amplifier and capacitive feedback means between the output and the input of the amplifier. It may comprise also manual switching means for changing the capacitance in the feedback means and thus adjusting the rate of change in the output voltage. It may comprise also logic means and switching means responsive thereto for changing the capacitance in the feedback means and thus adjusting the rate of change in the output voltage. Typically the latter switching means comprises switching gate means, optical isolator coupling means connected to the logic means for receiving a logic signal therefrom and providing in response thereto a predetermined output, translating amplifier means connected for providing in response to such output an actuating voltage that is connected to the switching gate means for closing a normally open conducting path therein for connecting a capacitance into the feedback means.

The apparatus typically comprises also logic means and switching means responsive thereto for discharging the capacitive feedback means and for connecting zero voltage to the input of the direct coupled amplifier and thus providing an initializing value of zero for the output voltage. Typically the switching means comprises switching gate means, optical isolator coupling means connected to the logic means for receiving a logic signal therefrom and providing in response thereto a predetermined output, translating amplifier means connected for providing in response to such output an actuating voltage that is connected to the switching gate means for closing two normally open conducting paths therein, the first path connecting a resistance across the capacitive feedback means and thus discharging the capacitance therein and providing zero feedback voltage, and the second path connecting the input of the direct coupled amplifier to ground, the closing of both paths thus providing zero voltage at the output of the direct coupled amplifier.

Typically the output of the direct coupled amplifier is connected to an output buffer amplifier, and the output of the output buffer amplifier typically is limited by voltage clamping means.

The apparatus typically comprises also means, responsive to the condition that the value of the output voltage is the predetermined proportion of the input voltage, for providing a signal to indicate the readiness of the apparatus to receive a new input voltage, and means responsive to the readiness signal for providing a new input voltage to the apparatus in place of the present one. Typically the readiness responsive means comprises logic means responsive to the readiness signal and connected to provide a flag signal to a central processing unit that is programmed to provide in response thereto the next in a predetermined series of digital voltage signals to a digital to analog converter for providing, in response to each digital voltage signal, an analog voltage signal proportional thereto as the input voltage to the apparatus.

The central processing unit typically is programmed to provide also in response to the flag signal a test comparing the new digital voltage signal with the preceding one and if the test determines that the new one has the same sign as the preceding one, and is smaller in absolute value by more than a preselected amount, to provide a logic signal for actuating switching means in the apparatus to cause the output voltage to change in the direction opposite from the direction in which it would change if the switching means were not actuated.

The apparatus typically comprises also polarity inverter means and means responsive to a change in the input voltage for connecting the polarity inverter means to the potential providing means, and thus reversing the polarity of the potential received by the integrating means and the direction of change provided thereby in the output voltage, when an input voltage is received that has the same polarity as the preceding one and is smaller in amplitude by more than a negligible amount.

The potential providing means typically comprises an input isolating amplifier connected to receive the input voltage, a first inverting amplifier with substantial gain connected to receive the output from the isolating amplifier, and a constant voltage amplifier connected through a resistance to receive the output from the first inverting amplifier and to provide, with delay, the potential to the integrating means, the polarity inverter means comprises a second inverting amplifier having first and second input connections and an output connection, the first inverting amplifier output side of the resistance is connected also to the first input of the second inverting amplifier, substantially zero voltage is connected to the second input of the second inverting amplifier, the output therefrom is a voltage having opposite polarity from that of the first input, the polarity inverter connecting means comprises switching means for connecting the output of the second inverting amplifier to the constant voltage amplifier side of the resistance and thus providing as the input to the constant voltage amplifier a voltage having opposite polarity from that of the output of the first inverting amplifier; the potential provided to the integrating means thus being opposite in polarity, with the output of the second inverting amplifier so connected, from what it would be otherwise.

The polarity inverter connecting means typically comprises logic means and switching means responsive thereto. Typically the switching means comprises switching gate means, optical isolator coupling means connected to the logic means for receiving a logic signal therefrom and providing in response thereto a predetermined output, translating amplifier means connected for providing in response to such output an actuating voltage that is connected to the switching gate means for closing a normally open conducting path therein.

Typically the logic means provides a positive logic signal in response to the presence of an input voltage that has the same polarity as the preceding one and is smaller in amplitude by more than a preselected negligible amount. The apparatus typically comprises also a central processing unit programmed to provide a test that effectively compares each new input voltage with the preceding one and to provide a logic signal to the logic means when the test indicates the presence of an input voltage that has the same polarity as the preceding one and is smaller in amplitude by more than the preselected negligible amount.

Typically the output voltage is connected to a controlled system that is connected to means responsive to a predetermined condition therein, and the output voltage condition responsive means includes means for selectively connecting it to be responsive either (a) to the predetermined condition of the output voltage only, or (b) to the combination of the predetermined condition of the output voltage and the predetermined condition in the controlled system. The output voltage condition responsive means typically comprises a first latch responsive to the comparison voltage, a second latch responsive to the controlled system condition responsive means, and a logic gate responsive to the first and second latches. The selective connecting means typically comprises switching means for connecting the second latch to be responsive selectively either (a) to a predetermined constant setting input, or (b) to a setting input that comprises means responsive to the predetermined condition in the controlled system.

The resetting input to both the first and the second latches typically comprises the output from means responsive to the connecting to the apparatus of an input voltage that differs by more than a negligible amount from the preceding one. Typically the resetting input comprises the output from the difference amplifier comprises the output from the difference amplifier means receiving the voltages proportional to the input and output voltages, and means responsive to the rate of change of the comparison voltage therefrom. The rate of change responsive means typically comprises differentiating means connected between the difference amplifier means and the resetting inputs of the latches. The logic gate typically comprises a nand gate connected to receive the set outputs of the first and second latches and means responsive to a logic zero output of the nand gate for providing a current signal to means responsive thereto for providing a new input voltage to the apparatus.

The controlled system condition responsive means typically comprises difference amplifier means for receiving a first voltage responsive to the predetermined condition in the controlled system and a second voltage comprising a predetermined reference voltage and providing a comparison voltage responsive to any more than negligible difference between the first and second voltages. Typically the comparison voltage provided by the difference amplifier means is connected (a) to first rectifier means connected to conduct current in a predetermined direction between the difference amplifier means and a preselected point in the apparatus, and (b) to inverting amplifier means the output of which is connected to second rectifier means connected to conduct current in the same predetermined direction between the inverting amplifier means and the preselected point, so that a comparison voltage of one polarity provides current in the predetermined direction through the first rectifier means and a comparison voltage of the opposite polarity provides current in the same predetermined direction through the second rectifier means and thus the difference amplifier means provides signals of the same polarity at the preselected point regardless of the polarity of the comparison voltage.

DRAWINGS

FIG. 3 is a schematic diagram showing in greater detail typical circuitry for apparatus according to the present invention as shown in FIG. 1 between the two vertical dashed lines and below the horizontal dashed line.

FIG. 4 is a graph of input and output voltages against time during a typical period of operation of the apparatus shown in FIGS. 1–3.

DETAILED DESCRIPTION

Figure 1:
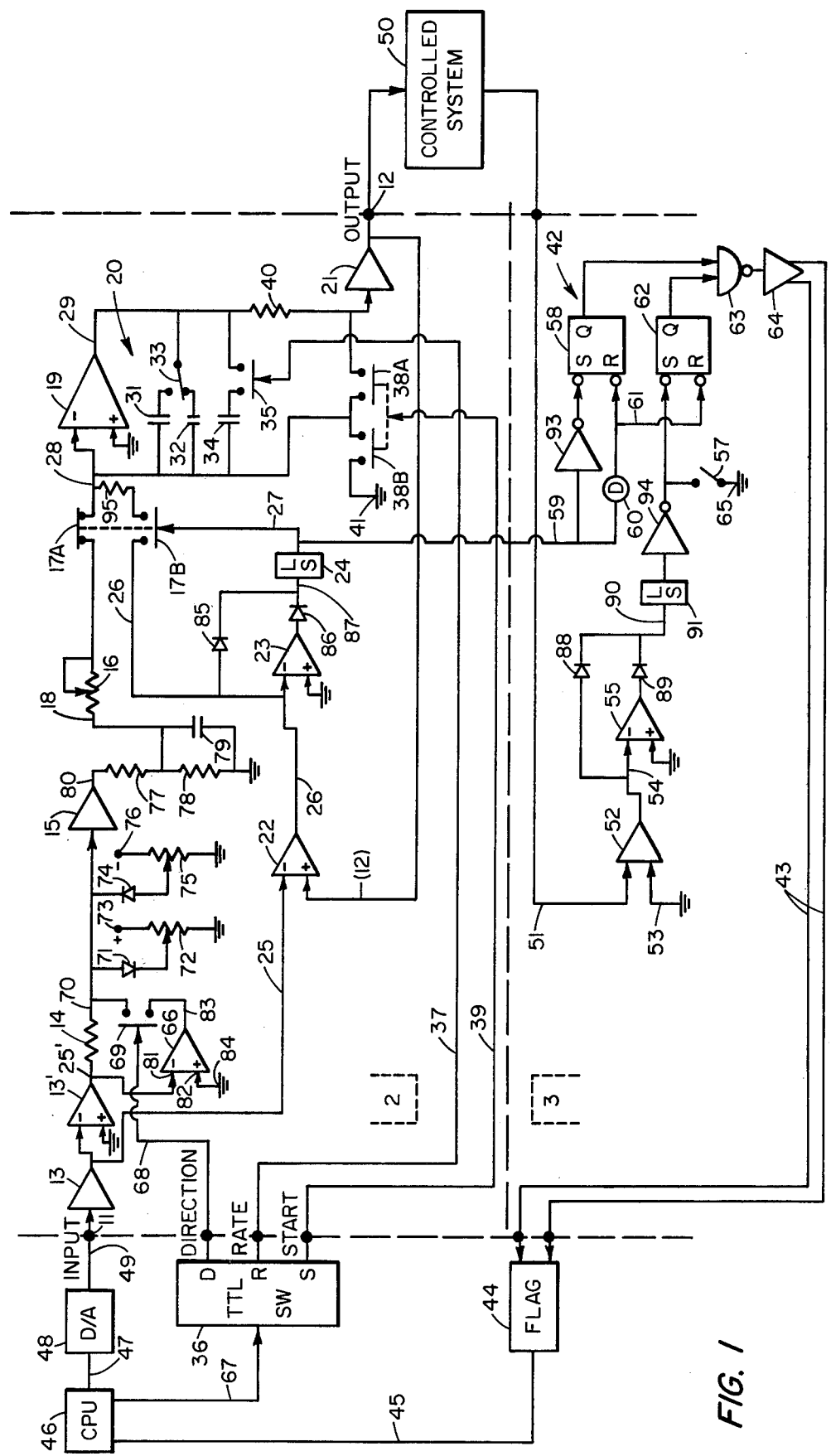
FIG. 1 is a block diagram showing typical apparatus according to the present invention.

FIG. 1 illustrates a typical embodiment of a system comprising apparatus according to the present invention. The portion of the system in the left hand part of FIG. 1 comprises typical apparatus for controlling the operation of the main portion of the apparatus, the ramp generator, as shown in block diagram form with some of the primary circuit features between the two vertical dashed lines, which provides voltages for controlling the system shown in the right hand portion of FIG. 1. The upper portion of the ramp generator in FIG. 1 between the vertical dashed lines and above the horizontal dashed line is shown in more detail in FIG. 2. The lower portion, below the dashed line, is shown in more detail in FIG. 3. The reference numerals in FIG. 1 are all less than 100. The same reference numerals are used for the same components and features where they appear in FIG. 2 or FIG. 3, while additional components and features are designated by reference numerals greater than 100.

All potentials indicated in the drawings or mentioned herein are with respect to ground. Except where a different value is shown, all terminals marked "+" are connected to a source of positive 15 volts (above ground) and all marked "−" are connected to a source of negative 15 volts (below ground).

Referring now primarily to FIG. 1, typical apparatus according to the present invention, for receiving a succession of input voltages 11 that may vary in discrete steps in amplitude and polarity with time and providing a substantially linear ramp output voltage 12 responsive thereto, comprises means 13, 13', 14, 15, 77, 78, 79 for receiving each input voltage 11 and providing a potential 18 responsive thereto, integrating means 19, 20 for receiving each potential 18 (via 16, 17A), providing in response thereto (via 40, 21) an output voltage 12 that changes approximately proportionally with time from its old value responsive to the preceding input voltage 11 and potential 18 to a new value that is responsive to the new input voltage 11 and potential 18 each time an input voltage 11 is received that differs by more than a negligible amount from the preceding one, and then maintaining the output voltage 12 substantially constant until the next such time, and difference amplifier means 22 for receiving a first voltage 25 proportional to the input voltage 11 and a second voltage (12) proportional to the output voltage 12 and providing a comparison voltage 26 responsive to any more than negligible difference between the first and second voltages 25, 12, switching means 17A, 17B responsive to the difference amplifier means 22 (via 85, 23, 86, 87, 24, 27) for connecting the integrating means 19, 20 selectively, either (a), while such a difference exists, (via 16, 17A) to the potential 18 responsive to the input voltage 11, for beginning and then continuing its integrating, or (b), when such a difference does not exist, (via 17B) to the comparison voltage 26, for correcting the output voltage 12, when necessary, to a value that is a predetermined proportion of the input voltage 11, and, when the output voltage 12 is correct, maintaining it substantially constant.

The comparison voltage 26 provided by the difference amplifier means 22 is connected (a) to first rectifier means 85 connected to conduct current in a predetermined direction (left to right in the drawings) between the difference amplifier means 22 and a preselected point 87 in the apparatus, and (b) to inverting amplifier means 23 the output of which is connected to second rectifier means 86 connected to conduct current in the same predetermined direction (left to right) between the inverting amplifier means 23 and the preselected point 87, so that a comparison voltage 26 of one polarity (positive) provides current in the predetermined direction (left to right) through the first rectifier means 85 and a comparison voltage 26 of the opposite polarity (negative) provides current in the same predetermined direction (left to right, since the inverted output from the amplifier 23 is positive) through the second rectifier means 86 and thus the difference amplifier means 22 provides signals of the same polarity (positive) at the preselected point 87 regardless of the polarity of the comparison voltage 26. The switching means 17A, 17B is connected to be actuated by a signal at the preselected point 87 (as fed by the level shifting amplifier 24 to the actuating conductor 27).

The switching means comprises switching gate means 17A, 17B having first and second switching paths therein, each being open when the other is closed and closed when the other is open (and thus comprising the equivalent of a single-pole double-throw switch), responsive to a substantially zero actuating voltage thereto (at 27) for opening the first path 17A and closing the second path 17B, and responsive to a larger (positive) actuating voltage thereto (at 27) for closing the first path 17A and opening the second path 17B, the first path 17A being connected between the integrating means 19, 20 and the potential 18 responsive to the input voltage 11, and the second path 17B being connected between the integrating means 19, 20 and the comparison voltage 26.

The potential providing means comprises an input isolating amplifer 13 connected to receive the input voltage 11, an inverting amplifier 13' with substantial gain connected to receive the output from the isolating amplifier 13, and a constant voltage amplifier 15 connected to receive the output from the inverting amplifier 13' and to provide, with delay (via 77, 78, 79), the potential 18 to the integrating means 19, 20 (via 16, 17A).

The input 20 to the constant voltage amplifier 15 is limited by voltage clamping means 71–76 that comprises first rectifying means 71 connected from the input 70 of the constant voltage amplifier 15 to an adjustable source 72, 73 of positive voltage and second rectifying means connected from the input 70 of the constant voltage amplifier 15 to an adjustable source 75, 76 of negative voltage, for providing firstly (via 72) an adjustment of any positive input 70 and secondly (via 75) an adjustment of any negative input 70 to the constant voltage amplifier 15 and thus providing respectively independent adjustments firstly (via 72) of the rate of change of the output voltages 12 in the positive direction and secondly (via 75) of the rate of change of the output voltages 12 in the negative direction provided by the integrating means 19, 20.

The delay is provided by resistance and capacitance means 77, 78, 79 connected at the output 80 of the constant voltage amplifier 15. The resistances 77 and 78 also form a voltage divider, so that the potential 18 is only a preselected fraction of the voltage at 80. The potential providing means comprises also an adjustable resistance 16 between the constant voltage amplifier 15 (via 77) and the integrating means 19, 20, for providing a continuously variable adjustment of current therethrough to the integrating means 19, 20 and thus also of the rate of change in the output voltage 12 (in either direction ) provided by the integrating means 19, 20.

The integrating means comprises a direct coupled amplifier 19 and capacitive feedback means 20 between the output 29 and the input 28 of the amplifier 19. It may comprise also manual switching means 33 for changing the capacitance 31, 32 (34) in the feedback means 20 (as by connecting in the circuit either a larger capacitance 31 or a smaller capacitance 32) and thus adjusting the rate of change in the output voltage 12 (in either direction). It may comprise also logic means 36 and switching means 35 responsive (via 37, RATE) thereto for changing the capacitance (31, 32) 34 in the feedback means 20 (as by connecting and disconnecting an additional capacitance 34) and thus adjusting the rate of change in the output voltage 12 (in either direction). The latter switching means typically comprises switching gate means 35, optical isolator coupling means 111 (FIG. 2) connected to the logic means 36 for receiving a positive logic signal 36R (RATE) therefrom and providing in response thereto a zero voltage output (112 to 113), translating amplifier means 114 connected 112 (via 115, 116) for providing in response to such output an actuating voltage (at 117) that is connected (via 37) to the switching gate means 35 for closing a normally open conducting path 35 therein for connecting the capacitance 34 into the feedback means 20. The optical isolator coupling means 111 and the translating amplifier means 114 provide a bipolar drive circuit for the switching gate means 35, with no need for a common ground path. (As is indicated at 118, a positive voltage provides a space charge to the switching gate 35.

The apparatus typically comprises also logic means 36 and switching means 38A, 38B responsive (via 39, START) thereto for discharging (via 38A) the capacitive feedback means 31, 32, 34 (via 40) and for connecting zero voltage (via 38B, grounding to 41) to the input 28 of the direct coupled amplifier 19 and thus providing an initializing value of zero for the output voltage 12. The switching means typically comprises switching gate means 38A, 38B, optical isolator coupling means 121 (FIG. 2) connected to the logic means 36 for receiving a positive logic signal 36S (START) therefrom and providing in response thereto a zero voltage output (122 to 123), translating amplifier means 124 connected 122 (via 125, 126) for providing in response to such output an actuating voltage (at 127) that is connected (via 39) to the switching gate means 38A, 38B for closing two normally open conducting paths therein, the first path 38A connecting the resistance 40 across the capacitive feedback means 20 and thus discharging the capacitance 31, 32, 34 (whichever is or are connected) therein and providing zero feedback voltage, and the second path 38B connecting the input 28 of the direct coupled amplifier 19 to ground 41 (via a resistance 131), the closing of both paths 38A, 38B thus providing zero voltage at the output 29 of the direct coupled amplifier 19. The optical isolator coupling means 121 and the translating amplifier means 124 provide a bipolar drive circuit for the switching gate means 38A, 38B, with no need for a common ground path. (As is indiated at 128, a positive voltage provides a space charge to the switching gates 38A, 38B.)

Figure 2:
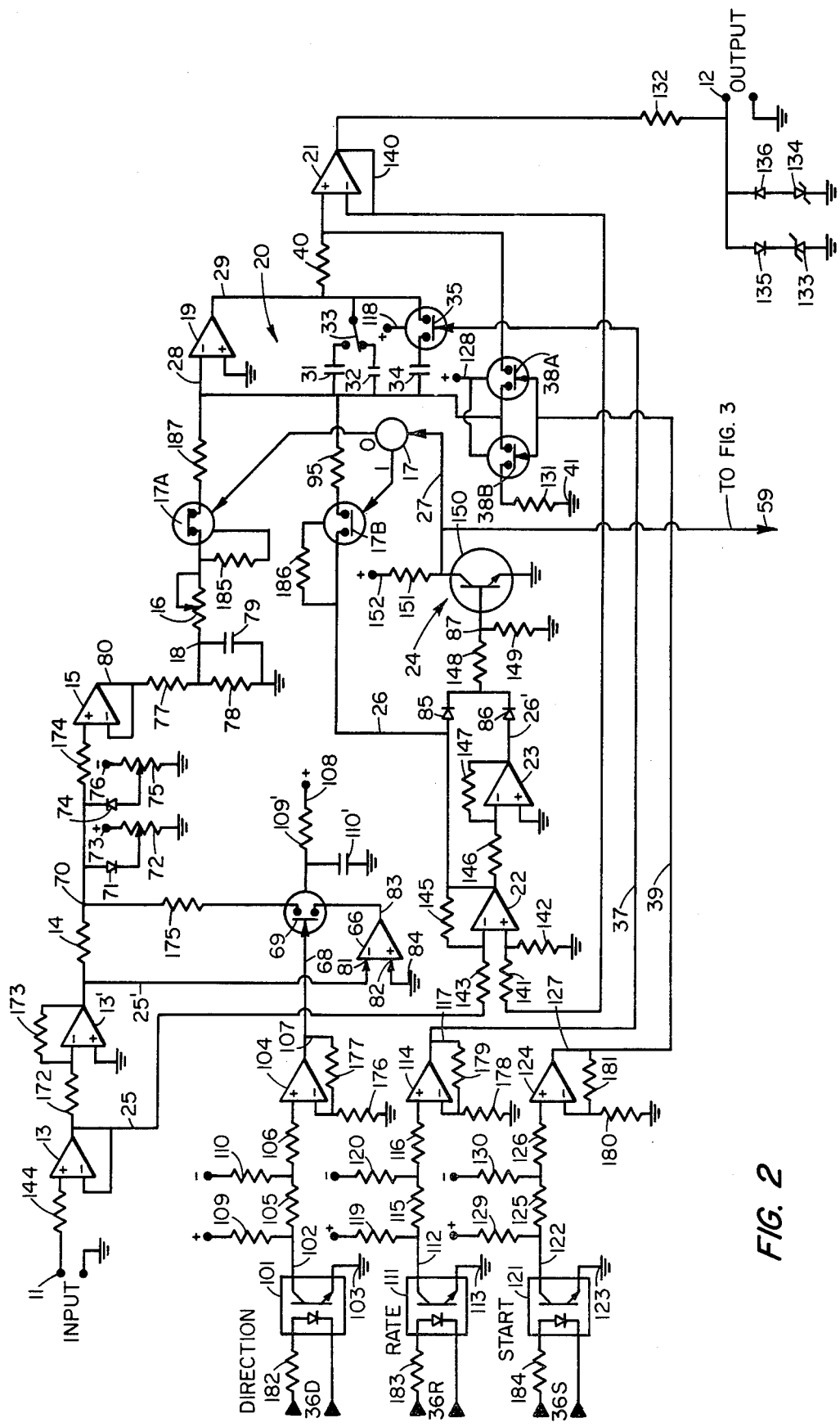
FIG. 2 is a schematic diagram showing in greater detail typical circuitry for apparatus according to the present invention as shown in FIG. 1 between the two vertical dashed lines and above the horizontal dashed line.

The output 29 of the direct coupled amplifier 19 is connected to an output buffer amplifier 21, and the output 12 of the output buffer amplifier 21 (via a resistance 132, FIG. 2) typically is limited by voltage clamping means 133-136 to protect the controlled system 50 from receiving a voltage large enough to damage it. When a positive output from the output buffer amplifier 21 increases to a value that causes the voltage across the zener diode 133 to reach a predetermined value, it fires and then maintains the same voltage across it (increasing the voltage drop across the series resistance 132) if the output of the amplifier 21 increases further. Thus the positive output voltages at 12 are limited to a predetermined safe range. The series diode rectifier 135 is optional. In the apparatus of FIG. 2 it is included to provide a slightly higher positive output voltage limit at 12 that would be permitted by the zener diode 133 alone. The other zener diode 134 and its optional series diode rectifier 136 function in the same way to limit the negative output voltages at 12 to a predetermined safe range.

The apparatus typically comprises also means 42, responsive to the condition that the value of the output voltage 12 is the predetermined proportion of the input voltage 11, for providing a signal 43 to indicate the readiness of the apparatus to receive a new input voltage 11, and means 44-49 responsive to the readiness signal 43 for providing a new input voltage 11 to the apparatus in place of the present one. The readiness responsive means typically comprises logic means 44 responsive to the readiness signal 43 and connected to provide a flag signal 45 to a central processing unit 46 that is programmed to provide in response thereto the next in a predetermined series of digital voltage signals 47 to a digital to analog converter 48 for providing, in response to each digital voltage signal, an analog voltage signal 49 proportional thereto as the input voltage 11 to the apparatus.

The central processing unit 46 typically is programmed to provide also in response to the flag signal 45 a test comparing the new digital voltage signal with the preceding one and if the test determines that the new one has the same sign as the preceding one, and is smaller in absolute value by more than a preselected amount, to provide a logic signal (via 67, 36, 36D, 68) for actuating switching means 69 in the apparatus to cause the output voltage 12 to change in the direction opposite from the direction in which it would change if the switching means 69 were not actuated.

The apparatus comprises also polarity inverter means 66 and means 67, 36, 36D, 68, 69 responsive (via 46) to a change in the input voltage 11 for connecting the polarity inverter means 66 to the potential providing means 13-16, and thus reversing the polarity of the potential 18 received by the integrating means 19, 20 and the direction of change provided thereby in the output voltage 12, when an input voltage 11 is received that has the same polarity as the preceding one and is smaller in amplitude by more than a negligible amount.

The potential providing means comprises an input isolating amplifier 13 connected to receive the input voltage 11, a first inverting amplifier 13' with substantial gain connected to receive the output from the isolating amplifier 13, and a constant voltage amplifier 15 connected through a resistance 14 to receive the output 25' from the first inverting amplifier 13' and to provide, with delay (via 77, 78, 79), the potential 18 to the integrating means 19, 20 (via 16, 17A) the polarity inverter means comprises a second inverting amplifier 66 having first 81 and second 82 input connections and an output connection 83, the first inverting amplifier output side 25' of the resistance 14 is connected also to the first input 81 (negative) of the second inverting amplifier 66, substantially zero voltage 84 is connected to the second input 82 (positive) of the second inverting amplifer 66, the output 83 therefrom is a voltage having opposite polarity from that of the first input 81, and the polarity inverter connecting means comprises switching means 69 for connecting the output 83 of the second inverting amplifier 66 to the constant voltage amplifier side 70 of the resistance 14 and thus providing as the input 70 to the constant voltage amplifier 15 a voltage having opposite polarity from that of the output 25' of the first inverting amplifier 13'; the potential 18 provided to the integrating means 19, 20 thus being opposite in polarity, with the output of the second inverting amplifer 66 so connected, from what it would be otherwise.

The polarity inverter connecting means typically comprises logic means 36, 36D (DIRECTION) and switching means 69 responsive (via 68) thereto. As is shown in FIG. 2, the switching means typically comprises switching gate means 69, optical isolator coupling means 101 connected to the logic means 36 for receiving a positive logic signal 36D (DIRECTION) therefrom and providing in response thereto a zero voltage output (102 to 103), translating amplifier means 104 connected 102 (via 105, 106) for providing in response to such output an actuating voltage (at 107) that is connected (via 68) to the switching gate means 60 for closing a normally open conducting path 69 therein. The optical isolator coupling means 101 and the translating amplifier means 104 provide a bipolar drive circuit for the switching gate means 69, with no need for a common ground path. (As is indicated at 108, a positive voltage provides a space charge to the switching gate 69 via a resistance 109'. A capacitance 110' is connected from the resistance 109' to ground, to decouple noise from the power supply to the substrate of the switching gate 69.)

The logic means 36 provides a positive logic signal at 36D in response to the presence of an input voltage 11 that has the same polarity as the preceding one and is smaller in amplitude by more than a preselected negligible amount. The presence of such an input voltage 11 typically is signalled to the logic switch 36 by the central processing unit 46 (via 67) when the test mentioned above comparing a new digital voltage signal with the preceding one determines that the new one has the same sign as the preceding one and is smaller in absolute value by more than the preselected amount. The apparatus comprises also a central processing unit 46 programmed to provide a test that effectively compares each new input voltage 11 with the preceding one and to provide a logic signal (via 67) to the logic means 36 when the test indicates the presence of an input voltage 11 that has the same polarity as the preceding one and is smaller in amplitude by more than the preselected negligible amount.

Typically the output voltage 12 is connected to a controlled system 50 that is connected 51 to means 52-56 responsive to a predetermined condition therein, and the output voltage condition responsive means 42 includes means 57 for selectively connecting it to be responsive either (a) to the predetermined condition of the output voltage 12 only, or (b) to the combination of the predetermined condition of the output voltage 12 and the predetermined condition in the controlled system 50. The output voltage condition responsive means 42 typically comprises a first latch 58 responsive to the comparison voltage 26, a second latch 62 responsive to the controlled system condition responsive means 52-56, and a logic gate 63 responsive to the first and second latches 58, 62. The selective connecting means typically comprises switching means 57 for connecting the second latch 62 to be responsive selectively either (a) to a predetermined constant setting input 57, 65, or (b) to a setting input that comprises means 51-56, 88-91, 94 responsive to the predetermined condition in the controlled system 50.

The resetting input to both the first and the second latches 58, 62 comprises the output 61 from means 22, 23, 24, 60 responsive to the connecting to the apparatus of an input voltage 11 that differs by more than a negligible amount from the preceding one. Typically the resetting input comprises the output 61 from the difference amplifier means 22, 23 receiving the voltages 25, 12 proportional to the input 11 and output 12 voltages, and means 60 responsive to the rate of change of the comparison voltage 26 (via 85, 23, 86, 87, 24) therefrom. The rate of change responsive means comprises differentiating means 60 connected between the difference amplifier means 22, 23 (via 85, 86, 24) and the resetting inputs 61 of the latches 58, 62. The logic gate typically comprises a nand gate 63 connected to receive the set outputs Q (159, 162 in FIG. 3) of the first and second latches 58, 62 and means 64 responsive to a logic zero output of the nand gate 63 for providing a current signal (via 43) to means 44, 46, 48 responsive thereto for providing a new input voltage 11 to the apparatus.

The controlled system condition responsive means typically comprises difference amplifier means 52 for receiving (via 51) a first voltage responsive to the predetermined condition in the controlled system 50 and a second voltage comprising a predetermined reference voltage 53 and providing a comparison voltage 54 responsive to any more than negligible difference between the first and second voltages 51, 53. A typical predetermined condition is the state of a servo system, the first voltage (at 51) being zero when it is balanced; and the second (reference) voltage 53 is zero (ground in FIG. 1), so that the comparison voltage 54 is zero when the servo system 50 is balanced.

The comparison voltage 54 provided by the difference amplifier means 52 is connected (a) to first rectifier means 88 connected to conduct current in a predetermined direction (left to right in the drawings) between the difference amplifier means 52 and a preselected point 90 in the apparatus, and (b) to inverting amplifier means 55 the output of which is connected to second rectifier means 89 connected to conduct current in the same predetermined direction (left to right) between the inverting amplifier means 55 and the preselected point 90, so that a comparison voltage 54 of one polarity (positive) provides current in the predetermined direction (left to right) through the first rectifier means 88 and a comparison voltage 54 of the opposite polarity (negative) provides current in the same predetermined direction (left to right, since the inverted output from the amplifier 55 is positive) through the second rectifier means 89 and thus the difference amplifier means 52 provides signals of the same polarity (positive) at the preselected point 90 regardless of the polarity of the comparison voltage 54.

OPERATION

In a typical sequence of operations the first step is to set the output voltage 12 of the apparatus to zero. As the computer program begins its execution, the central processing unit 46 provides an initializing signal at 67 to the logic switch 36. The central processing unit 46 also signals via 47 the digital to analog converter 48 to provide a zero (ground level) voltage input 11 to the ramp generator. In response to its control signal, the logic switch 36 provides a positive voltage (logic one) at 36S. Referring now to FIG. 2, the positive voltage at 36S is connected to an input current limiting resistance 184 in series with the photodiode input portion of the optical isolator and coupler 121 (start) providing enough current through the photodiode to produce sufficient light to the phototransistor output portion to reduce its impedance nearly to zero and thus to reduce the output voltage 122 at its collector nearly to the ground level (zero) connected to its emitter at 123. This causes the resistance network 125, 126, 129, 130 to provide a negative voltage input to the translating amplifier 124 and thus to provide also a negative output therefrom at 127. (In the absence of light from the input photodiode of the optical isolator 121 the output impedance between the collector and the emitter of the output phototransistor is virtually infinite and the potential at 122 is a substantial positive voltage (above ground) as provided by the voltage divider network resistances 129, 125, 130. This provides a positive input voltage to the translating amplifier 124 and a positive output therefrom at 127.)

The negative voltage at 127, connected via the line 39 to the switching gate means 38A, 38B, together with the positive voltage at 128, provide a potential difference therebetween sufficient to cause the switching circuits 38A, 38B to close. The integrator amplifier 19 is now functioning as an inverting amplifier with a gain of approximately one.

It takes up to approximately 20 milliseconds for the capacitors 31, 32, 34 (whichever is or are connected in the capacitive feedback circuit 20) to discharge through the resistance 40, and for the output voltage 12 from the non-converting output buffer amplifier 21 at 140 through the resistance 132 to come to zero volts, if it had been at a different value. There is no current now through the resistance 132, and the output of the buffer amplifier 121 at 140 and the output voltage 12 to the controlled system 50 are both zero.

With zero potential on the line 140, the resistances 141, 142 (connected from the line 140 to the plus input of the difference amplifier 22 and from there to ground) also are at zero potential and the plus input to the difference amplifier 22 is at zero (ground) potential. Since the input voltage 11 that is fed to the input isolating amplifier 13 via the input resistance 144 to zero, its output at 25 also is zero. This zero voltage is fed via the resistance 143 to the minus input of the difference amplifier 22. Since both of the inputs to the difference amplifier 22 are zero, its output voltage at 26 is zero, and there is no current in the feedback resistance 145. The zero voltage at 26 is fed via the resistance 146 to the minus input of the inverter amplifier 23, so its output voltage at 26' also is zero, and there is no current in its feedback resistance 147. Since the output voltage 26 of the difference amplifier 22 and the output voltage 26' of the inverter amplifier 23 are both zero, there is no potential difference across either of the rectifiers 85, 86, or either of the resistances 148, 149. Thus the input at 87 to the base of the transistor 150 of the level shifting amplifier 24 is zero; so the impedance from the collector at 27 to the emitter and ground is substantially infinite, and there is little or no current through (or voltage drop across) the resistance 151 connected to the collector of the transistor 150. Thus the positive voltage at 152 is connected via the resistance 151 to the line 59 and provides a logic one input, connected (as shown in FIG. 3) via the input coupling resistance 153 to the base of the transistor 154 of the inverter 93. This saturates the transistor 154 making the impedance from the collector at 157 to the emitter and ground become very small and causing a substantial current from the positive 5 volts connected at 156 to the resistance 155 and the collector circuit of the transistor 154 to ground and changing the potential at 157 from its former value of approximately plus 5 volts, which provided a logic one input to the set input S of the first SR gate 58, to substantially zero (ground) potential, and now providing a logic zero input thereto. With the logic zero set input thus provided, the nand gate 158 in the SR gate 58 provides a logic one signal at the Q output thereof to the line 159, which provides one of the two inputs to the nand gate 63.

Meanwhile the setting input S of the second SR gate 62 was already at a logic zero by virtue of a substantially zero potential at the line 160 connected to the S input, as provided either by circuitry similar to that just described above (as is disclosed in more detail later herein) or by the switch 57 having been closed to connect the ground potential at 65 to the input line 160 at the setting input S of the SR gate 62. Thus the nand gate 161 has already provided a logic one at the Q output 162 of the SR gate 62, which is connected to the other input of the nand gate 63.

Thus the output at 163 of the nand gate 63, which had been at logic one (positive voltage) level, is now set at logic zero (substantially ground, zero voltage) level, and the inverter 163', which is connected thereto, provides a logic one output (positive voltage) to the resistance 164. The voltage divider resistances 164 and 165 provide a positive voltage at their junction 167, which is connected as the input to the base of the transistor 166 in the current driver 64. The output impedance between the collector 168 and the grounded emitter (which had been substantially infinite, with zero voltage input at 167) becomes nearly zero and thus closes the (formerly open) circuit of the current loop from the positive voltage at 170 through the current limiting resistance 169, the input to the flag circuit 44 (via the conductors 43), and the transistor 166, to ground.

The flag circuit 44 typically comprises logic circuitry controlled by the input to an optical isolator of the same type as those (101, 111, 121) shown in FIG. 2 and described herein, with the conductors 43 of the current loop circuit 64 connected (as at 36D, 36R, or 36S) via a current limiting resistance (as at 182, 183, or 184) to the photodiode input portion of the optical isolator. The flag circuit 44 typically comprises also logic circuitry similar to that of the direction, rate, and start switching gate control circuits shown in the left hand part of FIG. 2, to provide (as at 68, 37, or 39) a logic signal via the line 45 to the central processing unit 46, indicating to the computer that the ramp generator apparatus has been initialized and is ready to receive an input voltage 11 and to provide a ramp output voltage 12 responsive thereto.

The flag signal also causes the computer (via 46, 67) to remove the logic one signal from the input 36S (start) to the optical isolator 121 and to replace it with a logic zero signal (zero voltage). The logic zero signal from the logic switch 36 typically in transistor-transistor logic circuitry comprises effectively a short circuit across 36S. With some alternative circuitry the logic zero might be effectively an open circuit across 36S (no signal at all). In either case, there is little or no current through the photodiode input portion of the optical isolator 121, and little or no light therefrom, so the impedance of the phototransistor output portion is substantially infinite. Thus the potential at 122 is substantially above ground as provided by the voltage divider network resistances 129, 125, 130. The potential at the junction of the resistances 125, 130, and 126 is smaller, but still enough above ground potential to provide a substantial positive input to the translating amplifier 124 and a substantial positive output therefrom at 127. The feedback resistance 181 and the minus input resistance 180 connected to ground limit the output voltage at 127 to a suitable range at which the potential difference between 127, connected via the line 39 to the switching gates 38A, 38B, and the positive voltage at 128, is small enough to cause the switching circuits 38A, 38B to open, and thus to enable the direct coupled amplifier 19 with its capacitive feedback circuit to perform normally as an integrating amplifier.

In response to the flag signal, the central processing unit 46 provides the first digital word (input voltage signal) via the line 47 to the digital to analog converter 48, which provides the corresponding analog input voltage via the line 49 to the input point 11 of the ramp generator. The input voltage at 11 is fed via the input coupling resistance 144 (FIG. 2) to the input isolating amplifier 13, which provides an output voltage at 25 that is substantially equal to the input voltage 11. The voltage 25 is fed by the input coupling resistance 143 to the minus input of the difference amplifier 22, the output of which is fed via the input coupling resistance 146 to the minus input of the inverting amplifier 23. The output voltage of the output buffer amplifier 21, fed by the line 140 and the input coupling resistance 141 to the plus input of the difference amplifier 22, is still zero.

If the input voltage 11 is of more than negligible amplitude, the voltage 25, which has the same polarity and is approximately equal, causes the difference amplifier 22 to provide a more than negligible voltage at its output 26. If the input voltage (11), 25, is negative, the output voltage of the difference amplifier 22, at 26, is positive, and provides a current from 26 through the diode rectifier 85 and the input resistances 148, 149 to ground. If the input (11), 25 is positive, the output voltage at 26 of the difference amplifier 22 is negative, and the diode rectifier 85 blocks any more than negligible current through it. However, the negative voltage at 26 is fed by the input resistance 164 to the minus input of the inverting amplifier 23 (the plus input of which is grounded) and the amplifier 23 provides an inverted output at 26' that is positive and thus provides a current through the diode rectifier 86 and the resistances 148, 149 to ground. Thus, whether the input voltage (11), 25 is negative or positive, a current is provided through the resistances 148, 149, and a positive potential is provided at the input point 87 to the base of the transistor 150 of the level shifting amplifier 24. The positive input at 87 saturates the transistor 150, so the impedance from the collector at 27 to the emitter and ground is substantially zero, and the potential at 27 also is substantially zero.

The line 59 (from FIG. 2 to FIG. 3) feeds the substantially zero potential at 27 to the input coupling resistance 153, which is connected to the base of the transistor 154 of the inverter 93. This causes the impedance from the collector at 157 to the emitter and ground to become substantially infinite and the potential at 157 changes from its former value of approximately zero to approximately positive 5 volts as connected at 156 to the resistance 155 and the line 157. Thus, the set input S of the first SR gate 58 is changed from its former logic zero to a present logic one.

The line 59 is connected also by the input coupling resistance 200 to the base input of the transistor 204 in the differentiating circuit 60. The change from a high positive potential to substantially zero potential on the line 59 causes the impedance between the collector and the emitter of the transistor 204 to change from substantially zero to a very high value, and this causes the potential at the collector of the transistor 204 to increase from a small to a large positive value. This change in potential provides a current in the differentiating circuit comprising the capacitance 206 and the resistance 208. The current through the resistance 208 increases the input potential at the base enough to saturate the transistor 210, reducing its output impedance between the collector and the emitter, and thus providing a nearly zero potential (logic zero) at the collector, which is connected by the line 61 to the reset input R of the first SR gate 58 and to the reset input R of the second SR gate 62. The logic zero signal on the line 61 causes the output of the nand gate 213 in the first SR gate 58 to be a logic one. The logic one output from the nand gate 213 is fed as one of the two inputs to the nand gate 158 in first SR gate 58, and this combined with the logic one on the line 157 connected to the other input (the S input of the first SR gate 58) provides a logic zero at the output of the nand gate 158, which is connected to the set output Q of the first SR gate 58 and is connected by the line 159 as one of the two inputs to the nand gate 63.

Thus, regardless of whether the other input 162 to the nand gate 63 is at logic one or at logic zero, the output of the nand gate 63 is a logic one at 163 and the inverter 163', which is connected thereto, provides a logic zero output (substantially zero voltage) to the resistance 164. The input at 167 to the base of the transistor 166 thus is approximately at ground potential, and the output impedance between the collector 168 and the grounded emitter (which had been very small with a positive voltage input at 167) becomes substantially infinite and thus opens the circuit of the current loop from the positive voltage at 170 through the resistance 169, the input to the flag circuit 144 (via the conductors 43) and the transistor 166, to ground.

(If the line 160 to the setting input S of the second SR gate 62 is at logic one, the above description of the states within the first SR gate 58 applies similarly to the second SR gate 62 and the set output Q at the line 162 goes to logic zero. If the line 160 is at logic zero, however, the set output at Q of the second SR gate 62 on the line 162 remains at logic one. The conditions described above are the same regardless of the state of the line 162, since a logic zero on the line 159 is sufficient to provide a logic one at the output 163 of the nand gate 63.)

Referring now to FIG. 2, the substantially zero potential at the output 27 of the level shifting amplifier 24 is connected to actuate the switching gate 17 so as to close the circuit at 17A and to open the circuit at 17B (the positions of 17A, 17B as shown in FIGS. 1 and 2), and thus to connect the integrating circuit 19, 20 via the resistance 187, the closed circuit at 17A, and the potentiometer 16 to the potential at 18.

The input voltage 11 is connected by the resistance 144 to the plus input of the input isolating amplifier 13, the output of which at 25 is fed back to the minus input. The output 25 of the isolating amplifier 13 is fed also by a resistance 172 to the minus input of the inverting amplifier 13', the plus input of which is connected to ground. The feedback resistance 173 is large enough to permit the inverting amplifier 13' to provide substantial gain, typically about 100, so that the inverted output at 25' is a substantial voltage even when the input voltage 11 is small. The output 25' is fed by resistances 14 and 174 to the plus input of the constant voltage amplifier 15. The positive voltage clamp comprising the diode rectifier 71 and the potentiometer 72 connected to the positive voltage source 73 limits the amplitude of any positive voltage at the point 70 to a value above ground equal to the potential at the adjustable arm of the potentiometer 72 plus a small voltage across the diode 71. Similarly the negative voltage clamp comprising the diode rectifier 74 and the potentiometer 75 connected to the negative voltage source 76 limits the amplitude of any negative voltage at the point 70 to a value below ground equal to the potential at the adjustable arm of the potentiometer 75 and a small voltage across the diode 74.

With any input voltage 11 that is more than negligible, the output of the inverting amplifier 13' is large enough to provide a potential at the point 70 of substantially greater amplitude than any limits permitted by the positive and negative voltage clamps at the point 70. Thus, in normal operation, the potential at the point 70 is either a substantially constant positive voltage as determined by the adjustment of the positive voltage clamp 71, 72, 73 or a substantially constant negative potential as determined by the negative voltage clamp 74, 75, 76. Likewise, the voltage fed by the resistance 174 to the plus input of the constant voltage amplifier 15 is either a substantially constant positive voltage as determined by the positive voltage clamp 71, 72, 73 or a substantially constant negative voltage as determined by the negative voltage clamp 74, 75, 76.

The output at 80 of the constant voltage amplifier 15 is connected to the minus input, so the voltage at 80 is approximately equal to the plus input voltage from the resistance 174, has the same polarity, and is substantially constant. The voltage divider resistances 77, 78 provide a lower potential at the point 18 (typically about one-eleventh of the potential at 80). The capacitance 79 causes a short delay in the building up of the potential at 18, to allow for the time involved in the actuation of the switching gate 17, 17A, 17B by the comparison circuit 22, 23, 24, etc. The potential at 18 is fed via the potentiometer 16, the closed switch 17A, and the resistance 187 to the minus input at 29 of the inverting integrator amplifier 19, in which the plus input is connected to ground. The output at 29 of the integrating amplifier 19 begins to increase (or decrease) substantially linearly with time, and continues to ramp at the same rate until it reaches a voltage that is substantially equal to the input voltage 11.

The rate of change in the voltage at 29 is in accordance with the following equation:

$$r = E/RC$$

where
r is the ramp rate, in volts per second;
E is the potential at 18, in volts;
R is the total resistance between 18 and 28 (16, 17A, 187), in ohms; and
C is the total capacitance between 28 and 29 (31 or 32, whichever is connected to the switch 33; and 34 if it is connected by the switch 35), in farads.

The voltage at 29 is fed by the resistance 40 to the plus input of the output buffer amplifier 21, the output of which is connected by the line 140 to its minus input. The output at 140 is connected also by the resistance 132 to the output terminal 12, to which the controlled system 50 is connected.

The output voltage of the output buffer amplifier 21 is fed also by the line 140 and the resistance 141 to the plus input of the difference amplifier 22. When this voltage becomes nearly equal to (typically within about one percent of) the input voltage (11), 25 as fed by the resistance 143 to the minus input of the difference amplifier 22, its output voltage at 26 is reduced substantially to zero.

The substantially zero voltage at 26 is fed by the resistance 146 to the minus input of the inverter amplifier 23, the plus input of which is connected to ground, so its output voltage at 26' also is substantially zero. Since the output voltage 26 of the difference amplifier 22 and the output voltage 26' of the inverter amplifier 23 are both substantially zero, there is at most only a negligible potential difference across either of the rectifiers 85, 86, or either of the resistances 148, 149. Thus the input at 87 to the base of the transistor 150 of the level shifting amplifier 24 is substantially zero. So the impedance from the collector at 27 to the emitter and ground is substantially infinite, and there is little or no current through (or voltage drop across) the resistance 151 connected to the collector of the transistor 150. Thus the positive voltage at 152 is connected by the resistance 151 to the line 27 and actuates the switching gate 17 so as to open the circuit at 17A and to close the circuit at 17B (the opposite of the positions of 17A, 17B as shown in FIGS. 1 and 2), and thus to disconnect the minus input of the integrating amplifier 19 from the potential at 18, and to connect it instead via the resistance 95 and the closed circuit at 17B to the comparison voltage at 26 from the difference amplifier 22.

If the output voltage as fed by the line 140 and the resistance 141 to the plus input of the difference amplifier 22 is not quite equal to the input voltage (11), 25 as fed by the resistance 143 to the minus input of the difference amplifier 22, a small voltage will be present at the output 26 of the difference amplifier 22; and it will provide a proportional correction current in the capacitive feedback circuit 20 in the proper direction to increase or decrease the voltage at 140 until it is equal to the voltage at 25. Then the net input to the difference amplifier 22 becomes zero, its output at 26 becomes zero, and the ramp voltage output at 140 remains at the same voltage until it is changed in response to a new input voltage 11 in the manner just described. (If the voltage of 140 was already exactly equal to the voltage at 25 when the switch 17B was closed, there was of course no voltage at 26 and no current in the capacitive feedback circuit 20 of the integrator 19, 20, as no correction was needed.)

The ramp generator output voltage 12 typically is applied to a controlled system 50 having substantially infinite input impedance, so there is little or no current in the resistance 132, and the output voltage 12 is substantially equal to the voltage from the output buffer amplifier 21 at the line 140. Only if an abnormal condition, such as a programming error causing an input voltage 11 to be applied that was outside the proper range enough to cause the ramp voltage at 140 to exceed a limit set by the output clamping circuit 133, 135, 134, 136, would the output voltage 12 be any different from (lower than) the output of the output buffer amplifier 21 at 140.

The positive voltage 152 is connected also via the resistance 151 to the line 159 and provides a logic one input, connected (as shown in FIG. 3) via the input coupling resistance 153 to the base of the transistor 154 of the inverter 93. This saturates the transistor 154 making the impedance from the collector at 157 to the emitter and ground become very small and causing a substantial current from the positive 5 volts connected at 156 to the resistance 155 and the collector circuit of the transistor 154 to ground and charging the potential at 157 from its former value of approximately plus 5 volts, which provided a logic one input to the set input S of the first SR gate 58, to substantially zero (ground) potential, and now providing a logic zero input thereto. With the logic zero set input thus provided, the nand gate 158 in the SR gate 58 provides a logic one signal at the Q output thereof to the line 159, which provides one of the two inputs to the nand gate 63.

The setting input S of the second SR gate 62 may be provided with a logic zero (substantially zero potential) at the line 160 connected to the S input, either by circuitry similar to that just described above or by the switch 57 having been closed to connect the ground potential at 65 to the input line 160 at the setting input S of the SR gate 62.

When it is desired to assure not only that the ramp output voltage 12 has become equal to the input voltage 11, but also that the controlled system 50 be in a predetermined condition such that it can properly receive and make use of the next ramp output voltage 12, the switch 57 is placed in its open position, as shown in FIGS. 1 and 3. This removes the short circuit from the line 160 to the ground 65 and makes the potential on the line 160 dependent upon a signal from the controlled system 50 on the line 51 as responded to by the error comparator circuitry 52, 55, 91, 94, etc., as shown in the lower portion of FIG. 1 and in the lower left and lower middle portions of FIG. 3.

Typically the controlled system 50 includes a servo system that provides a voltage of substantially zero on the line 51 when it is balanced. Or it may include any appropriate circuitry responsive to a predetermined condition in such manner that the voltage on line 51 is substantially zero when the controlled system 50 is in the predetermined condition.

Any voltage on the line 51 from the controlled system 50 is fed via a filtering circuit comprising series resistances 215 and 217 and shunt capacitances 216 and 218, for minimizing any appreciable noise from the line 51, to the plus input of an isolating amplifier 219, the output of which is connected by a line 220 to the minus input thereof. The output at 220 of the amplifier 219 is fed by a resistance 221 and a line 222 to the plus input of the difference amplifier 52, the minus input of which is connected by a resistance 223 to the ground at 53. Before the ramp generator is put into operation a potentiometer 226, connected between the output line 54 of the difference amplifier 52 and the minus input thereof, and a potentiometer 224 whose adjustable arm 225 is connected to a potential of minus 15 volts and whose ends are connected to the two terminals designated for the purpose on the difference amplifier 52 (terminals 1 and 5 on a type 741 operational amplifier), both are adjusted to provide zero voltage at the output terminal 54 when a zero voltage input is connected to the plus input terminal 222.

When the voltage on the line 51 is of more than negligible amplitude, the voltage at 222, which has the same polarity and is approximately equal, causes the difference amplifier 52 to provide a more than negligible voltage at its output 54. If the voltage at 51 is positive, the output voltage of the difference amplifier 52, at 54, also is positive, and provides a current from 54 through the diode rectifier 88 and the input resistances 230, 231 to ground. If the voltage at 51 is negative, the output voltage at 54 of the difference amplifier 52 also is negative, and the diode rectifier 88 blocks any more than negligible current through it. However, the negative voltage at 54 is fed by the input resistance 227 to the minus input of the inverting amplifier 55 (the plus input of which is grounded at 228) and the amplifier 55 provides an inverted output to the feedback resistance 229 and the diode 89 that is positive and thus provides a current through the diode rectifier 89 and the resistances 230, 231 to ground. Thus, whether the voltage at 51 is positive or negative, a current is provided through the resistances 230, 231, and a positive potential is provided at the input point 90 to the base of the transistor 233 of the level shifting amplifier 91. The positive input at 90 saturates the transistor 233, so the impedance from the collector at 56 to the emitter and ground at 234 is substantially zero, and the potential at 56 also is substantially zero.

The substantially zero potential at 56 is fed to the input coupling resistance 235, which is connected to the base of the transistor 237 of the inverter 94. This causes the impedance from the collector at 160 to the emitter and ground to be substantially infinite and the potential at 160 is approximately positive 5 volts as connected to the resistance 236 and the line 160. Thus, the setting input S of the second SR gate 62 is now at a logic one.

When the controlled system 50 reaches its predetermined condition, and the voltage on the line 51 thus becomes substantially zero, the output of the isolating amplifier 219, at 220, also becomes approximately zero. This voltage is fed via the resistance 221 to the plus input of the difference amplifier 52. Since both of the inputs to the difference amplifier 52 are now approximately zero, its output voltage at 54 is zero. The zero voltage at 54 is fed via the resistance 227 to the minus input of the inverter amplifier 55, so its output voltage also is zero, and there is no current in its feedback resistance 229. Since the output voltage 54 of the difference amplifier 52 and the output voltage of the inverter amplifier 55 are both zero, there is no potential difference across either of the rectifiers 88, 89, or either of the resistances 230, 231. Thus the input at 90 to the base of the transistor 233 of the level shifting amplifier 91 is zero; so the impedance from the collector 56 to the emitter and ground at 234 is substantially infinite, and there is little or no current through (or voltage drop across) the resistance 232 connected to the collector of the transistor 233. Thus the positive voltage at 232 is connected via the resistance 232 to the line 56 and provides a logic one input, connected via the input coupling resistance 235 to the base of the transistor 237 of the inverter 94. This saturates the transistor 237 making the impedance from the collector at 160 to the emitter and ground become very small and causing a substantial current from the positive 5 volts connected to the resistance 236 and the collector circuit of the transistor 237 to ground and chaning the potential at 160 from its former value of approximately plus 5 volts, which provided a logic one input to the set input S of the second SR gate 62, to substantially zero (ground) potential, and now providing a logic zero input thereto. With the logic zero set input thus provided, the nand gate 161 in the SR gate 62 provides a logic one signal at the Q output thereof to the line 162, which provides one of the two inputs to the nand gate 63.

As described above, the other input 159 to the nand gate 63 already was at a logic one. With both inputs 159, 162 now at a logic one, the output at 163 of the nand gate 63, which had been at logic one (positive voltage) level, is now set at logic zero (substantially ground, zero voltage) level, and the inverter 163' of the current driver 64, which is connected thereto, provides a logic one output (positive voltage) to the resistance 164. The voltage divider resistances 164 and 165 provide a positive voltage at their junction 167, which is connected as the input to the base of the transistor 166 in the current driver 64. The output impedance between the collector 168 and the grounded emitter (which had been substantially infinite, with zero voltage input at 167) becomes nearly zero and thus closes the (formerly open) circuit of the current loop from the positive voltage at 170 through the current limiting resistance 169, the input to the flag circuit 44 (via the conductors 43), and the transistor 166, to ground.

The flag circuit 44 typically comprises logic circuitry controlled by the input to an optical isolator of the same type as those (101, 111, 121) shown in FIG. 2 and described herein, with the conductors 43 of the current loop circuit 64 connected (as at 36D, 36R, or 36S) via a current limiting resistance (as at 182, 183, or 184) to the photodiode input portion of the optical isolator. The flag circuit 44 typically comprises also logic circuitry similar to that of the direction, rate, and start switching gate control circuits shown in the left hand part of FIG. 2, to provide (as at 68, 37, or 39) a logic signal via the line 45 to the central processing unit 46, indicating to the computer that the ramp generator apparatus has completed its presently assigned function and is ready to receive the next input voltage 11 and to provide a new ramp output voltage 12 responsive thereto.

In response to this latest flag signal, the central processing unit 46 provides the next digital input voltage signal via the line 47 to the digital to analog converter 48, which provides the corresponding analog input voltage via the line 49 to the input point 11 of the ramp generator. If the new input voltage 11 is opposite in polarity from the last one (or if it is of the same polarity and greater in amplitude by more than a negligible amount), the ramp generator performs again in the manner just described to provide a new ramp voltage that changes approximately linearly with time from the present output voltage 12 to a new output voltage 12 that is substantially equal to the new input voltage 11. Then when the controlled system 50 reaches its predetermined condition (substantially immediately in some systems, later in others), the logic memory circuit 42 provides a new flag signal to the flag switch 44, and the apparatus proceeds to perform in the same manner as the next input voltage is furnished, etc.

FIG. 4 is a graph of voltage against time, illsutrating operation of the apparatus during a typical period. The step input voltages 11 are labeled with capital letters, and the output voltages 12 with reference numerals.

Typical operations as described above are illustrated at A, B, C, D, 1, 2, 3, and 4 in FIG. 4. Assume that the output voltage was minus 4 just before the initialization began, and that the first three input voltages were 3, −2, and −5 volts respectively. In the initializing operation, when the switch 38B closes the equivalent of a zero input voltage, indicated at A, is fed to the minus input 28 of the integrating amplifier 19. At the same time, the switch 38A also closes discharging the capacitive feedback circuit 20 of the integrator 19, 20 and thus changing the output voltage exponentially from minus 4 to zero, as indicated at 1. When the first input, 3 volts, is applied, the output voltage increases linearly with time from zero to 3 volts, as indicated at 2, and remains at that value until the next input voltage, minus 2 volts, is received, as indicated at C. Then the output voltage changes linearly with time from 3 volts to minus 2 volts, as indicated at 3, and remains at that value until the next input, minus 5 volts is received, as indicated at D. Then the output voltage changes linearly with time from minus 2 volts to minus 5 volts, as indicated at 4, and it remains at that value until the next input voltage is received. The operations just summarized in this paragraph are performed as described in detail above in this section on operation.

Assume now that the next input is minus 1 volt, as indicated at E. To provide the linear ramp output from minus 5 volts to minus 1 volt, as indicated at 5, involves additional circuitry and functions.

In the drawings and description herein, inputs to the various operational amplifiers that are labeled "+" in the drawings and referred to in the description as positive or plus inputs are noninverting inputs, the outputs from which have the same polarity as the input. In the drawings and description herein, inputs to the various operational amplifiers that are labeled "−" in the drawings and referred to in the description as negative or minus inputs are inverting inputs, the outputs from which have the opposite polarity from the input.

In the integrating circuit 19, 20, the direct current amplifier 19 functions as an inverting integrator; the output at 29 being opposite in polarity from the input at 28, so that a charging voltage can be provided and maintained across the capacitance (s) 31, 32, 34 (whichever is or are connected) in the capacitive feedback circuit 20. The majority of the time, as in the operations described and summarized above, it is necessary for the output voltage 12 to change in the positive direction to move from its old value to a new value equal to the new input voltage 11 when the new input voltage 11 is positive. Likewise, the majority of the time, as in the operations described and summarized above, it is necessary for the output voltage 12 to change in the negative direction to move from its old value to a new value equal to the new input voltage 11 when the new input voltage 11 is negative. Therefore, since the direction of change in the output of the inverting integrator amplifier 19 is negative when the input at 28 is positive and is positive when the input at 28 is negative, it is necessary to provide a second inversion somewhere between the input 11 and the output 12 of the ramp generator. The inverting amplifier 13' in FIGS. 1 and 2 provides this second inversion. Thus, by virtue of the inversion provided by the amplifier 13' and the inversion provided by the integrating amplifier 19, the output voltage 12 changes in the same direction to change from its old value to a new value equal to the input voltage 11 in the operations described above. Similarly, the difference amplifier 22 receives the input voltage 11 via the isolating amplifier 13 as its noninverted output 25 to the inverting (minus) input of the difference amplifier 22, to provide an inverted correction voltage at 26 having the proper polarity for the correction operation described above.

When a new input voltage 11 is received that has the same polarity as the preceding one and is smaller in amplitude by more than a negligible amount, the operations as described above would not be appropriate. They would cause the output voltage 12 to change further in the same direction in which it had changed in the last ramp. That is, a smaller positive input voltage 11 would cause the output voltage 12 to become more positive, and the apparatus would be out of control. Similarly, a smaller negative input voltage 11 would cause the output voltage 12 to become more negative, and the apparatus would be out of control. To cause the output voltage 12 to change in the proper direction, it is necessary either to remove the inversion provided by the inverting amplifier 13' or to add still another inversion. It is more convenient to add another inversion.

Referring back to FIG. 4, and starting at the time when the outpt voltage is equal to the input voltage of minus 5 volts, as indicated at D and 4, the next input voltage is minus 1 volt as indicated at E, and the output voltage is changed linearly with time from minus 5 volts to minus 1 volt, as indicated at 5, in the following manner.

Referring to FIG. 1, the flag circuit 44 has just provided a logic signal via the line 45 to the central processing 46, indicating to the computer that the ramp generator apparatus is ready to receive the next input voltage 11 and to provide a ramp output voltage 12 responsive thereto. In response to the flag signal 45, the central processing unit 46 also provides a test comparing the new digital voltage signal with the preceding one. If the test determines that the new digital voltage signal has the same sign as the preceding one, and is smaller in absolute value by more than a preselected amount, the central processing unit 46 provides a predetermined logic signal via the line 67 to the logic switch 36 for providing a direction control signal at 36D to close the switch 69.

Referring now to FIG. 2, the logic switch 36 provides a positive voltage (logic one) at 36D. The positive voltage at 36D is connected to an input current limiting resistance 182 in series with the photodiode input portion of the optical isolator and coupler 101 (direction) providing enough current through the photodiode to produce sufficient light to the phototransistor output portion to reduce its impedance nearly to zero and thus to reduce the output voltage 102 at its collector nearly to the ground level (zero) connected to its emitter at 103. This causes the resistance network 105, 106, 109, 110 to provide a negative voltage input to the translating amplifier 104 and thus to provide also a negative output therefrom at 107. (In the absence of light from the input photodiode of the optical isolator 101 the output impedance between the collector and the emitter of the output phototransistor is virtually infinite and the potential at 102 is a substantial positive voltage (above ground) as provided by the voltage divider network resistances 109, 105, 110. This provides a positive input voltage to the translating amplifier 104 and a positive output therefrom at 107.)

The negative voltage at 107, connected via the line 68 to the switching gate means 69, together with the positive voltage at 108, provide a potential difference therebetween sufficient to cause the switching gate 69 to close.

The negative input voltage at 11 provides a positive voltage at 25' from the output of the inverting amplifier 13'. If the switch 69 had not been closed (by the operations described immediately above), this positive voltage would have been fed by the resistance 14 to the voltage clamps at 70. However, with the switch 69 closed, the positive voltage at 25', which is fed to the inverting (minus) input 81 of the second inverting amplifier 66, provides a substantially amplified and further inverted (back to negative) voltage at its output 83, which is fed by the switch 69 and the resistance 175 to the junction point 70. The resistance 14 is substantially greater than (typically at least about ten times) the resistance 175. Thus, the potential at 70 is much closer to the negative voltage at 83 than it is to the positive voltage at 25'. Thus, the input to the constant voltage amplifier 15 is a negative voltage as limited by the negative voltage clamp 74, 75, 76. Since the constant voltage amplifier 15 is connected in the noninverting mode, its output voltage at 80, also is negative, as is the potential at 18, which is connected via 16, 17A, 187 to the inverting input 28 of the integrating amplifier 19, causing its output at 29 to change in the positive direction.

Thus, the output voltage 12 changes linearly with time in the positive direction, from its former value of −5 volts, until it equals the new input voltage 11 of −1 volt. The comparator circuit 22, 23, 24 of course is not affected by the position of the switch 69, so it stops the ramping operation, and provides a fine correction if necessary, in the same manner as described hereinbefore. It also causes the next flag signal to be actuated in the manner already described.

Each time a flag signal is sent to the central processing unit 46, it provides the test comparing the new digital voltage signal with the preceding one. If the test determines that the new one has the opposite sign from the preceding one, or that it is larger in absolute value (or both), it of course does not actuate the closing of the switching gate 69. Instead it provides an opposite logic signal (or alternatively no signal at all) to the logic switch 36 such as to provide a logic zero signal (zero voltage) at 36D (direction).

The logic zero signal from the logic switch 36 typically in transistor-transistor logic circuitry comprises effectively a short circuit across 36D. With some alternative circuitry the logic zero might be effectively an open circuit across 36D (no signal at all). In either case, there is little or no current through the photodiode input portion of the optical isolator 101, and little or no light therefrom, so the impedance of the phototransistor output portion is substantially infinite. Thus the potential at 102 is substantially above ground as provided by the voltage divider network resistances 109, 105, 110. The potential at the junction of the resistatnces 105, 110, and 106 is smaller, but still enough above ground potential to provide a substantial positive input to the translating amplifier 104 and a substantial positive output therefrom at 107. The feedback resistance 177 and the minus input resistance 176 connected to ground limit the output voltage at 107 to a suitable range at which the potential difference between 107, connected via the line 68 to the switching gate 69, and the positive voltage at 108, is small enough to cause the switching circuit 69 to open, and thus to disconnect the inverting amplifier 66 from the resistance 175 and the junction point 70.

The potentiometers 72, 75 are continuously adjustable to provide any desired relative rates of change in the output voltage 12 in the negative and positive directions respectively. The potentiometer 16 is continuously adjustable to increase or decrease the rate of change in the output voltage 12 proportionally in both directions. The manual switch 33 sets the general level of the rate of change in the output voltage in both directions by connecting either a larger capacitance 31 or a smaller capacitance 32 from the output 29 to the input 28 of the direct coupled amplifier 19. These manual adjustments are made before the computer program begins its execution.

When it is desired to provide two different rates of change in the output voltage 12 in both directions (or in one direction) during a single run, the computer program may provide logic signals to switch the additional capacitance 34 into and out of the feedback circuit at any desired point or points in the sequence of operations controlled by the computer program. Typically the capacitances 31 and 34 are approximately equal (say about 5 Mfd) and the capacitance 32 is about one tenth as large (say about 0.5 Mfd). Thus when the manual switch 33 is connected to the larger capacitance 31, the automatically controlled switch 35 can increase or decrease the rate of change in the output voltage in either direction by a factor of approximately 2. That is to say with the capacitance 34 connected in the circuit along with the capacitance 31 the rate of change in the output voltage 12 is only one half as great as it is as when the capacitance 34 is not connected. When the manual switch 33 is connected to the smaller capacitance 32, the ratio of ramp speeds provided by the automatically controlled switch 35 is about eleven to one. That is to say the ramp speed in either direction is about eleven times as great with the capacitance 34 not connected as it is when the capacitance 34 is connected in the feedback circuit.

Before the computer program provides the first input voltage control signal to the central processing unit 46 it provides an instruction that causes the central processing unit 46 to transmit via the line 67 to the logic switch 36 a rate control signal such as to provide a logic zero signal at 36R if the switching gate 35 is to be open, and remain open until the program furnishes a logic one signal at 36R; or such as to provide a logic one signal at 36R if the switching gate 35 is to be closed, and remain closed until the program furnishes a logic zero signal at 36R. Similar signals may then be provided at the appropriate points in the program whenever the state of the switching gate 35 is to be changed from open to closed or from closed to open.

In a typical operation when an instruction in the computer program causes the central processing unit 46 to provide a rate control signal at 67 to the logic switch 36 for closing the switching gate 35, and thus reducing the ramp rate, the logic switch 36 provides in response thereto a positive voltage (logic one) at 36R. Referring now to FIG. 2, the positive voltage at 36R is connected to an input current limiting resistance 183 in series with the photodiode input portion of the optical isolator and coupler 111 (rate) providing enough current through the photodiode to produce sufficient light to the phototransistor output portion to reduce its impedance nearly to zero and thus to reduce the output voltage 112 at its collector nearly to the ground level (zero) connected to its emitter at 113. This causes the resistance network 115, 116, 119, 120 to provide a negative voltage input to the translating amplifier 114 and thus to provide also a negative output therefrom at 117. (In the absence of light from the input photodiode of the optical isolator 111 the output impedance between the collector and the emitter of the output phototransistor is virtually infinite and the potential at 112 is a substantial positive voltage (above ground) as provided by the voltage divider network resistances 119, 115, 120. This provides a positive input voltage to the translating amplifier 114 and a positive output therefrom at 117.)

The negative voltage at 117, connected via the line 37 to the switching gate means 35, together with the positive voltage at 118, provide a potential difference therebetween sufficient to cause the switching gate 35 to close. The capacitance 34 is now connected in the feedback circuit 20, and the ramp speed is the lower of the two available speeds in each direction as determined by the adjustments of the potentiometers 72, 75, and 16 and the position of the manual switch 33.

When an instruction in the computer program causes the central processing unit 46 to provide a rate control signal at 67 to the logic switch 36 for increasing the ramp speed by disconnecting the capacitance 34 from the feedback circuit 20, the logic switch 36 responds to the rate control signal by removing the logic one signal from the input 36R (rate) to the optical isolator 111 and replacing it with a logic zero signal (zero voltage). The logic zero signal from the logic switch 36 typically in transistor-transistor logic circuitry comprises effectively a short circuit across 36R. With some alternative circuitry the logic zero might be effectively an open circuit across 36R (no signal at all). In either case, there is little or no current through the photodiode input portion of the optical isolator 111, and little or no light therefrom, so the impedance of the phototransistor output portion is substantially infinite. Thus the potential at 112 is substantially above ground as provided by the voltage divider network resistances 119, 125, 120. The potential at the junction of the resistances 115, 120, and 116 is smaller, but still enough above ground potential to provide a substantial positive input to the translating amplifier 114 and a substantial positive output therefrom at 117. The feedback resistance 179 and the minus input resistance 178 connected to ground limit the output voltage at 117 to a suitable range at which the potential difference between 117, connected via the line 37 to the switching gate 35, and the positive voltage at 118, is small enough to cause the switching circuit 35 to open, and thus to disconnect the capacitance 34 from the feedback circuit 20. The ramp speed is now the higher of the two available speeds in each direction as determined by the adjustments of the potentiometers 72, 75, and 16 and the position of the manual switch 33.

During the operations described above and illustrated in FIG. 4 at A, B, C, D, E, 1, 2, 3, 4, 5, the manual rate control switch 33 was connected to the larger capacitance 31, and the automatic rate controlling switch 35 was open. The output voltage is changed in the positive direction at a moderate rate, as indicated at 2 and 5, and as determined by the setting of the potentiometer 16, which affects both the positive rate and the negative rate, and by the setting of the potentiometer 75 in the negative voltage clamp 74, 75, 76, which affects only the rate of change in the positive direction. Similarly the output voltage is changed at another moderate (but not necessarily exactly the same) rate in the negative direction, as indicated at 3 and 4, and as controlled by the setting of the potentiometer 16, and the setting of the potentiometer 72 in the positive voltage clamp 71, 72, 73, which affects only the rate in the negative direction. Between the input voltages E and F an instruction was included in the computer program to reduce the ramping rate in both directions by closing the switching gate 35, and thus connecting the capacitance 34 in the feedback circuit 20 along with the capacitance 31. This was done in the manner described above, reducing the ramping rate from E to F, as indicated at 6, to approximately one half the ramping rate in the positive direction as indicated at 2 and 5. There was no contrary instruction in the computer program between F and G, so the ramping rate in the negative direction, as indicated in 7, was approximately one half the former rate, as indicated at 3 and 4.

The input voltages 11 and their corresponding output voltages 12 at the ends of the ramps may of course have any values within the range in which the apparatus is designed to operate. Integer values were used for the examples in connection with FIG. 4 merely for convenience. Instead of being only manually adjustable, any or all of the potentiometers 16, 72, 75, 224, and 226, and the switches 33 and 57, may be made subject to automatic control by the computer, if desired. Other types of voltage clamps may of course be substituted for the diode and potentiometer clamps 71, 72, 73 and 74, 75, 76, if preferred, and they may be adjusted manually or automatically, or both.

COMPONENTS

In a typical and presently preferred embodiment of the invention as shown in the drawings, the following units, components, and values were used.
Operational amplifiers, Type 741;
    13, 13', 15, 21, 22, 23, 52, 55, 66, 104, 114, 124, 163', 219 Motorola MC 1741
    19 Motorola MC 1741 SC
Switching gates;
    69 MM 555H, National (one-third of package)
    35, 38A, 38B MM 555H, National (one package)
    17, 17A, 17B, AH 2114C, (one package)
Optical Isolators 101, 111, 121 ILD 74, Litronics
Flip flops 58, 62 SN 7400 TTL Gate
Nand gate 63 SN 7400 TTL Gate
Transistors 150, 154, 166, 204, 210, 233, 237 NPN, 2N5818
Diodes;
    71, 74, 85, 86, 88, 89, 135, 136 IN 34A
    133, 134 Zener diodes, IN 1771A
Potentiometers;
    16 10K 1 percent carbon
    72, 75 2K Bourns 27 turns
    224 10K 1 percent carbon
    226 100K 1 percent carbon

| Capacitors | | |
|---|---|---|
| 31, 34 | 5. Mfd | NPO Capacitors, Sprague, 200 volts DC |
| 32 | .47 Mfd | NPO Capacitor, Sprague, 200 volts DC |
| 79 | .22 Mfd | |
| 110' | 1. Mfd | |
| 202 | .001 Mfd | |
| 206 | .02 Mfd | |
| 212 | .002 Mfd | |
| 216, 218 | .1 Mfd | |

Resistors, all 1 percent carbon:
  200 ohm; 205
  680 ohm; 182, 183, 184
  1K; 78, 131, 132, 141, 143, 169, 172, 176, 178, 180, 203, 221, 223,
  5K 221 6.8K 201
  10K; 40, 77, 106, 109, 109', 116, 119, 126, 129, 144, 146, 153, 165, 174, 175, 177, 179, 181, 209, 215, 217, 232, 235
  20K; 149, 151, 231
  91K; 200
  100K; 14, 105, 115, 125, 142, 145, 147, 148, 155, 164, 173, 185, 186, 227, 229, 230, 236
  200K; 110, 120, 130
  11M; 95
  22M; 207
Manual switches:
  33; Single pole, double throw
  57; Single pole, single throw
Power supplies:
  15 volts positive, Sola 83-15-216-2 (15 volts, 1 percent)
  15 volts negative, Sola 83-15-216-2 (separate supply)
  5 volts positive, Sola 83-05-230-2 (5 volts, 1 percent)
CPU 46; HP2100 computer, Hewlett-Packard.
D/A 48; DA/cards located in model 6940 subsystem of HP2100. Output device.
TTL SW 36; TTL cards located in model 6940 subsystem of HP2100. Output device.
Flag 44; Priorty interupt card in HP2100 main frame. Modified as described herein.
Controlled System 50; Materials Test Systems, Inc. 100 Kip. Closed loop electrohydraulic test system.

Some of the components shown in the drawings but not specifically referred to or described in detail herein are similar to those that are described herein and function similarly in similar circuitry. The others are conventional components used in conventional ways such as for providing appropriate voltage or current levels, partial isolation, coupling, feedback, etc. The input and control devices 46, 48, 36, and 44, and the controlled system 50, as shown in FIG. 1, to the extent that they are not specifically limited by the disclosure herein, may comprise any suitable details and features, conventional or otherwise, that may be compatible with their functions as disclosed herein.

While the forms of the invention herein disclosed constitute presently preferred embodiments, many others are possible. It is not intended herein to mention all of the possible equivalent forms or ramifications of the invention. It is to be understood that the terms used herein are merely descriptive rather than limiting, and that various changes may be made without departing from the spirit and scope of the invention.

I claim:

1. Apparatus for receiving a succession of input voltages that may vary in discrete steps in amplitude and polarity with time and providing a substantially linear ramp output voltage responsive thereto, comprising
  means for receiving each input voltage and providing a potential responsive thereto,
  integrating means for receiving each potential, providing in response thereto an output voltage that changes approximately proportionally with time from its old value responsive to the preceding input voltage and potential to a new value that is responsive to the new input voltage and potential each time an input voltage is received that differs by more than a negligible amount from the preceding one, and then maintaining the output voltage substantially constant until the next such time, and
  difference amplifier means for receiving a first voltage porportional to the input voltage and a second voltage proportional to the output voltage and providing a comparison voltage responsive to any more than negligible difference between the first and second voltages, switching means responsive to the difference amplifier means for connecting the integrating means selectively, either (a), while such a difference exists, to the potential responsive to the input voltage, for beginning and then continuing its integrating, or (b), when such a difference does not exist, to the comparison voltage, for correcting the output voltage when necessary, to a value that is a predetermined proportion of the input voltage, and, when the output voltage is correct, maintaining it substantially constant.

2. Apparatus as in claim 1, wherein the comparison voltage provided by the difference amplifier means is connected (a) to first rectifier means connected to conduct current in a predetermined direction between the difference amplifier means and a preselected point in the apparatus, and (b) to inverting amplifier means the output of which is connected to second rectifier means connected to conduct current in the same predetermined direction between the inverting amplifier means and the preselected point, so that a comparison voltage of one polarity provides current in the predetermined direction through the first rectifier means and a comparison voltage of the opposite polarity provides current in the same predetermined direction through the second rectifier means and thus the difference amplifier means provides signals of the same polarity at the preselected point regardless of the polarity of the comparison voltage.

3. Apparatus as in claim 2, wherein the switching means is connected to be actuated by a signal at the preselected point.

4. Apparatus as in claim 3, wherein the switching means comprises switching gate means having first and second switching paths therein, each being open when the other is closed and closed when the other is open, responsive to a substantially zero actuating voltage thereto for opening the first path and closing the second path, and responsive to a larger actuating voltage thereto for closing the first path and opening the second path, the first path being connected between the integrating means and the potential responsive to the input voltage, and the second path being connected between the integrating means and the comparison voltage.

5. Apparatus as in claim 1, wherein the potential providing means comprises an input isolating amplifier connected to receive the input voltage, an inverting amplifier with substantial gain connected to receive the output from the isolating amplifier, and a constant voltage amplifier connected to receive the output from the inverting amplifier and to provide, with delay, the potential to the integrating means.

6. Apparatus as in claim 5, wherein the input to the constant voltage amplifier is limited by voltage clamping means.

7. Apparatus as in claim 6, wherein the voltage clamping means comprises first rectifying means connected from the input of the constant voltage amplifier to an adjustable source of positive voltage and second rectifying means connected from the input of the constant voltage amplifier to an adjustable source of negative voltage, for providing firstly an adjustment of any positive input and secondly an adjustment of any negative input to the constant voltage amplifier and thus providing respectively independent adjustments firstly of the rate of change of the output voltages in the positive direction and secondly of the rate of change of the output voltages in the negative direction provided by the integrating means.

8. Apparatus as in claim 5, wherein the delay is provided by resistance and capacitance means connected at the output of the constant voltage amplifier.

9. Apparatus as in claim 5, wherein the potential providing means comprises also an adjustable resistance between the constant voltage amplifier and the integrating means, for providing a continuously variable adjustment of current therethrough to the integrating means and thus also of the rate of change in the output voltage provided by the integrating means.

10. Apparatus as in claim 1, wherein the integrating means comprises a direct coupled amplifier and capacitive feedback means between the output and the input of the amplifier.

11. Apparatus as in claim 10, comprising also manual switching means for changing the capacitance in the feedback means and thus adjusting the rate of change in the output voltage.

12. Apparatus as in claim 10, comprising also logic means and switching means responsive thereto for changing the capacitance in the feedback means and thus adjusting the rate of change in the output voltage.

13. Apparatus as in claim 12, wherein the switching means comprises switching gate means, optical isolator coupling means connected to the logic means for receiving a logic signal therefrom and providing in response thereto a predetermined output, translating amplifier means connected for providing in response to such output an actuating voltage that is connected to the switching gate means for closing a normally open conducting path therein for connecting a capacitance into the feedback means.

14. Apparatus as in claim 10, comprising also logic means and switching means responsive thereto for discharging the capacitive feedback means and for connecting zero voltage to the input of the direct coupled amplifier and thus providing an initializing value of zero for the output voltage.

15. Apparatus as in claim 14, wherein the switching means comprises switching gate means, optical isolator coupling means connected to the logic means for receiving a logic signal therefrom and providing in response thereto a predetermined output, translating amplifier means connected for providing in response to such output an actuating voltage that is connected to the switching gate means for closing two normally open conducting paths therein, the first path connecting a resistance across the capacitive feedback means and thus discharging the capacitance therein and providing zero feedback voltage, and the second path connecting the input of the direct coupled amplifier to ground, the closing of both paths thus providing zero voltage at the output of the direct coupled amplifier.

16. Apparatus as in claim 10, wherein the output of the direct coupled amplifier is connected to an output buffer amplifier.

17. Apparatus as in claim 16, wherein the output of the output buffer amplifier is limited by voltage clamping means.

18. Apparatus as in claim 1, comprising also means, responsive to the condition that the value of the output voltage is the predetermined proportion of the input voltage, for providing a signal to indicate the readiness of the apparatus to receive a new input voltage.

19. Apparatus as in claim 18, comprising also means responsive to the readiness signal for providing a new input voltage to the apparatus in place of the present one.

20. Apparatus as in claim 19, wherein the readiness responsive means comprises logic means responsive to the readiness signal and connected to provide a flag signal to a central processing unit programmed to provide in response thereto the next in a predetermined series of digital voltage signals to a digital to analog converter for providing, in response to each digital voltage signal, an analog voltage signal proportional thereto as the input voltage to the apparatus.

21. Apparatus as in claim 20, wherein the central processing unit is programmed to provide also in response to the flag signal a test comparing the new digital voltage signal with the preceding one and if the test determines that the new one has the same sign as the preceding one, and is smaller in absolute value by more than a preselected amount, to provide a logic signal for actuating switching means in the apparatus to cause the output voltage to change in the direction opposite from the direction in which it would change if the switching means were not actuated.

22. Apparatus as in claim 1, comprising also polarity inverter means and means responsive to a change in the input voltage for connecting the polarity inverter means to the potential providing means, and thus reversing the polarity of the potential received by the integrating means and the direction of change provided thereby in the output voltage, when an input voltage is received that has the same polarity as the preceding one and is smaller in amplitude by more than a negligible amount.

23. Apparatus as in claim 22, wherein the potential providing means comprises an input isolating amplifier connected to receive the input voltage, a first inverting amplifier with substantial gain connected to receive the output from the isolating amplifier, and a constant voltage amplifier connected through a resistance to receive the output from the first inverting amplifier and to provide, with delay, the potential to the integrating means, the polarity inverter means comprises a second inverting amplifier having first and second input connections and an output connection, the first inverting amplifier output side of the resistance is connected also to the first input of the second inverting amplifier, substantially zero voltage is connected to the second input of the second inverting amplifier, the output therefrom is a voltage having opposite polarity from that of the first input, and the polarity inverter connecting means comprises switching means for connecting the output of the second inverting amplifier to the constant voltage amplifier side of the resistance and thus providing as the input to the constant voltage amplifier a voltage having opposite polarity from that of the output of the first inverting amplifier; the potential provided to the integrating means thus being opposite in polarity, with the output of the second inverting amplifier so connected, from what it would be otherwise.

24. Apparatus as in claim 22, wherein the polarity inverting connecting means comprises logic means and switching means responsive thereto.

25. Apparatus as in claim 24, wherein the switching means comprises switching gate means, optical isolator coupling means connected to the logic means for receiving a logic signal therefrom and providing in response thereto a predetermined output, translating amplifier means connected for providing in response to such output an actuating voltage that is connected to the switching gate means for closing a normally open conducting path therein.

26. Apparatus as in claim 25, wherein the logic means provides a positive logic signal in response to the presence of an input voltage that has the same polarity as the preceding one and is smaller in amplitude by more than a preselected negligible amount.

27. Apparatus as in claim 26, comprising also a central processing unit programmed to provide a test that effectively compares each new input voltage with the preceding one and to provide a logic signal to the logic means when the test indicates the presence of an input voltage that has the same polarity as the preceding one and is smaller in amplitude by more than the preselected negligible amount.

28. Apparatus as in claim 18, wherein the output voltage is connected to a controlled system that is connected to means responsive to a predetermined condition therein, and wherein the output voltage condition responsive means includes means for selectively connecting it to be responsive either (a) to the predetermined condition of the output voltage only, or (b) to the combination of the predetermined condition of the output voltage and the predetermined condition in the controlled system.

29. Apparatus as in claim 28, wherein the output voltage condition responsive means comprises a first latch responsive to the comparison voltage, a second latch responsive to the controlled system condition responsive means, and a logic gate responsive to the first and second latches.

30. Apparatus as in claim 29, wherein the selective connecting means comprises switching means for connecting the second latch to be responsive selectively either (a) to a predetermined constant setting input, or (b) to a setting input that comprises means responsive to the predetermined condition in the controlled system.

31. Apparatus as in claim 29, wherein the resetting input to both the first and the second latches comprises the output from means responsive to the connecting to the apparatus of an input voltage that differs by more than a negligible amount from the preceding one.

32. Apparatus as in claim 31, wherein the resetting input comprises the output from the difference amplifier means receiving the voltages proportional to the input and output voltages, and means responsive to the rate of change of the comparison voltage therefrom.

33. Apparatus as in claim 32, wherein the rate of change responsive means comprises differentiating means connected between the difference amplifier means and the resetting inputs of the latches.

34. Apparatus as in claim 31, wherein the logic gate comprises a nand gate connected to receive the set outputs of the first and second latches and means responsive to a logic zero output of the nand gate for providing a current signal to means responsive thereto for providing a new input voltage to the apparatus.

35. Apparatus as in claim 28, wherein the controlled system condition responsive means comprises difference amplifier means for receiving a first voltage responsive to the predetermined condition in the controlled system and a second voltage comprising a predetermined reference voltage and providing a comparison voltage responsive to any more than negligible difference between the first and second voltages.

36. Apparatus as in claim 35, wherein the comparison voltage provided by the difference amplifier means is connected
   (a) to first rectifier means connected to conduct current in a predetermined direction between the difference amplifier means and a preselected point in the apparatus, and
   (b) to inverting amplifier means the output of which is connected to second rectifier means connected to conduct current in the same predetermined direction between the inverting amplifier means and the preselected point,
   so that a comparison voltage of one polarity provides current in the predetermined direction through the first rectifier means and a comparison voltage of the opposite polarity provides current in the same predetermined direction through the second rectifier means and thus the difference amplifier means provides signals of the same polarity at the preselected point regardless of the polarity of the comparison voltage.

* * * * *

UNITED STATES PATENT OFFICE
CERTIFICATE OF CORRECTION

PATENT NO. : 4,176,398
DATED : 11/27/79
INVENTOR(S) : Dennis G. Rider

It is certified that error appears in the above-identified patent and that said Letters Patent are hereby corrected as shown below:

Column 9, line 26, after "35." add -- ) --.
Column 11, line 20, change "60" to -- 69 --.
Column 13, line 43, change "to" to -- is --.
Column 15, line 43, change "164" to -- 146 --.
Column 17, line 45, change "29" to -- 28 --.
Column 18, line 68, change "159" to -- 59 --.
Column 19, line 8, change "charging" to -- changing --.
Column 21, line 57, change "illsutrating" to -- illustrating --.
Column 24, line 49, change "resistatnces" to -- resistances --.
Column 27, line 33, after "2114C," add -- National --.

Signed and Sealed this

Eighteenth Day of March 1980

[SEAL]

Attest:

SIDNEY A. DIAMOND

Attesting Officer

Commissioner of Patents and Trademarks